United States Patent
Thinakaran et al.

(10) Patent No.: US 9,866,237 B1
(45) Date of Patent: Jan. 9, 2018

(54) LOW POWER SWITCHED CAPACITOR INTEGRATOR, ANALOG-TO-DIGITAL CONVERTER AND SWITCHED CAPACITOR AMPLIFIER

(71) Applicant: Texas Instruments Incorporated, Dallas, TX (US)

(72) Inventors: Rajavelu Thinakaran, Bangalore (IN); Sumit Dubey, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/593,618

(22) Filed: May 12, 2017

(51) Int. Cl.
*H03M 3/00* (2006.01)
*H03H 19/00* (2006.01)
*H03M 1/12* (2006.01)

(52) U.S. Cl.
CPC .......... *H03M 3/422* (2013.01); *H03H 19/004* (2013.01); *H03M 1/1245* (2013.01); *H03M 3/45* (2013.01)

(58) Field of Classification Search
None
See application file for complete search history.

(56) References Cited

U.S. PATENT DOCUMENTS

| | | | | |
|---|---|---|---|---|
| 4,862,121 A * | 8/1989 | Hochschild | .......... | H03H 19/004 330/107 |
| 6,118,399 A * | 9/2000 | Krone | ................... | H03M 3/376 341/145 |
| 6,369,745 B1 * | 4/2002 | Lee | ......................... | H03M 3/32 327/337 |
| 6,614,285 B2 | 9/2003 | Lee et al. | | |
| 7,511,648 B2 | 3/2009 | Trifonov et al. | | |
| 7,564,389 B1 | 7/2009 | Byrd et al. | | |
| 7,880,538 B2 * | 2/2011 | Sharma | .................. | H03F 3/005 330/9 |
| 8,497,746 B2 * | 7/2013 | Visconti | ............... | H03H 19/004 327/337 |
| 8,941,438 B2 * | 1/2015 | Kapusta | ................... | H03F 1/34 330/86 |
| 2011/0063146 A1 | 3/2011 | Matthews et al. | | |

OTHER PUBLICATIONS

Haiyang Zhu et al., Noise Reduction Technique Through Bandwidth Switching for Switched-Capacitor Amplifier, IEEE Transactions on Circuits and Systems—I: Regular Papers, vol. 62, No. 7, Jul. 2015.*
B. Robert Gregoire et al., "An Over-60 dB True Rail-to-Rail Performance Using Correlated Level Shifting and an Opamp With Only 30 dB Loop Gain", IEEE Journal of Solid-State Circuits, vol. 43, No. 12, Dec. 2008, 11 pages.

* cited by examiner

*Primary Examiner* — Howard Williams
(74) *Attorney, Agent, or Firm* — John R. Pessetto; Charles A. Brill; Frank D. Cimino (57) ABSTRACT

Disclosed examples include switched capacitor integrator circuits including an amplifier, a feedback capacitor, a sampling capacitor, a loading capacitor and a switching circuit, along with a controller that operates the switching circuit to sample an input signal to the sampling capacitor during a sample portion of a given sample and hold cycle, to couple the sampling capacitor to an amplifier input during a first hold portion of each sample and hold cycle, and to couple the sampling capacitor and the loading capacitor to the amplifier input in a second hold portion of each sample and hold cycle to reduce the bandwidth and power consumption by the integrator circuit.

20 Claims, 7 Drawing Sheets

LOW POWER SWITCHED CAPACITOR INTEGRATOR, ANALOG-TO-DIGITAL CONVERTER AND SWITCHED CAPACITOR AMPLIFIER

BACKGROUND

Switched capacitor integrators are used in discrete time Sigma Delta analog-to-digital converter (SDADC) circuits, where the number of integrator circuits determines the order of the SDADC. The first integrator in a SDADC determines the overall power, area and performance of the ADC in terms of the effective number of bits (ENOB). The initial integrator circuit uses a sampling capacitor whose size is determined by noise specifications for a given application. The ADC linearity requirements and noise considerations, such as Signal-to-Quantization Noise Ratio (SQNR), determine the bandwidth of the integrator. These considerations often present an undesirable tradeoff between energy efficiency, performance and circuit area, where improved noise and performance specifications often call for larger sampling capacitor sizes, while large sampling capacitors increase the circuit area and power consumption.

SUMMARY

Presently disclosed examples include switched capacitor integrator circuits, switched capacitor amplifier circuits and discrete time Sigma Delta analog-to-digital converter circuitry. Disclosed example switched capacitor integrator circuits include an amplifier along with a switching circuit a feedback capacitor, a sampling capacitor and a loading capacitor. A controller operates the switching circuit to sample an input signal during a sample portion of a given sample and hold cycle. The controller implements a multi-part hold portion of the given cycle to couple the sampling capacitor to an amplifier input during a first hold portion and to couple the sampling capacitor and the loading capacitor to the amplifier input in a second hold portion to reduce the bandwidth and power consumption by the integrator circuit. Multi-order Sigma Delta analog-to-digital converters are disclosed which include an initial switched capacitor integrator circuit with extra loading capacitance introduced during a second hold portion of a sample and hold cycle. Switched capacitor amplifier circuitry is disclosed including feedback, sampling and loading capacitors, an amplifier, a switching circuit and a controller to implement a multi-part hold portion of each sample and hold cycle to introduce added capacitance in the second hold portion.

DETAILED DESCRIPTION

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 9:
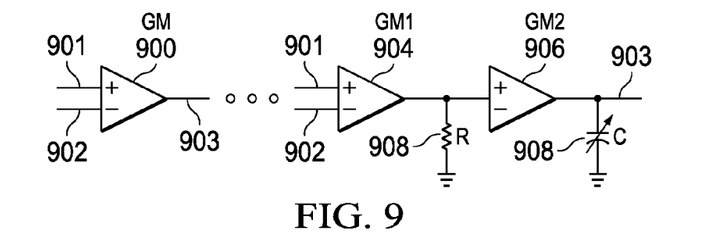
FIG. 9 is a schematic diagram of a transconductance amplifier and an equivalent circuit model.
Figure 10:
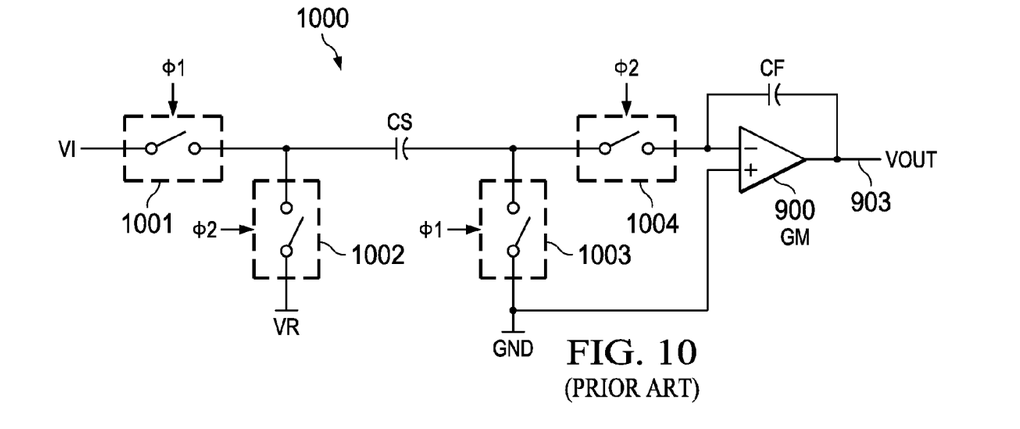
FIG. 10 is a schematic diagram of a conventional switched capacitor integrator circuit.
Figure 11:
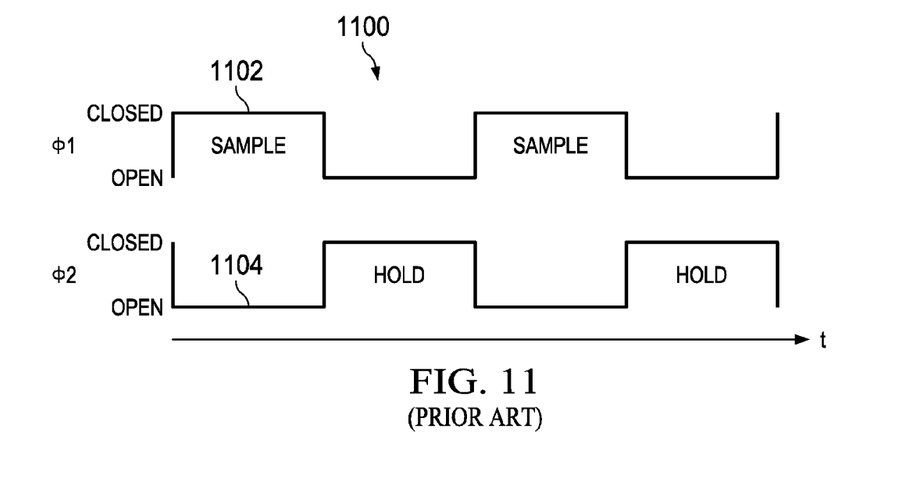
FIG. 11 is a signal diagram showing switching control signals in the switched capacitor integrator circuit of FIG. 10.

Disclosed amplifier and integrator circuits facilitate adaptation to meet improved noise and performance specifications while allowing a smaller sampling capacitor to enhance balance between performance specifications, power consumption and circuit area for a given design. FIGS. 9-11 illustrate a switched capacitor integrator circuit to demonstrate the shortcomings thereof. FIG. 9 shows a transconductance (GMA) amplifier 900 and an equivalent circuit model in which the single transconductance amplifier 900 is modelled as first and second stages 904 and 906 of respective gains (transconductances) GM1 and GM2, along with an intervening resistor R and an adjustable output capacitance C. The equivalent circuit model in FIG. 9 is only one of many possible configurations to implement or model a transconductance amplifier. In this example, the GM1 thermal noise is gained up by a factor GM2*R, and the transconductance GM1 is gained up a factor of GM2*R. This enables higher Bandwidth (proportional to GM/C) with lower power compared to a single stage GM cell. However the dual stage model suffers from higher noise compared to single stage GM cell. The transconductance amplifier 900 (GM) includes a non-inverting input 901 as well as an inverting input 902 and an output 903. The equivalent circuit shown on the right in FIG. 9 includes a first transconductance amplifier 904 (GM1) with an output connected to a ground connection 908 (GND) by a resistor R. The output of the first transconductance amplifier 904 is connected to the input of a second transconductance amplifier 906 (GM2), which includes an output 903 connected by a variable capacitor C to the ground connection 908. FIGS. 10 and 11 illustrate a switched capacitor integrator circuit 1000 and a signal diagram 1100 showing associated switching control signal curves 1102 and 1104. The circuit 1000 includes four switches 1001, 1002, 1003 and 1004 as well as the amplifier 900 of FIG. 9. The first switch 1001 is connected between an input voltage signal VI and a first terminal of a sampling capacitor CS. The first switch 1001 operates according to a first signal φ1, illustrated as a curve 1102 in FIG. 11. The second switch 1002 is connected between the first terminal of the sampling capacitor CS and a reference voltage signal VR. The second switch 1002 operates according to a second signal φ2 shown as curve 1104 in FIG. 11. The third switch 1003 is connected between the second terminal of the sampling capacitor CS and a ground connection GND, and operates according to the first signal φ1. The fourth switch 1004 is connected between the second terminal of the sampling capacitor CS and an inverting input (−) of the amplifier 1006. The fourth switch 1004 operates according to the second signal φ2. The amplifier 1006 includes a non-inverting input (+) connected to the ground connection GND. An output of the amplifier 1006 provides an integrator output voltage signal VOUT. A feedback capacitor CF is connected between the inverting input and the output of the amplifier 900. The integrator circuit 1000 of FIG. 10 operates according to the signals φ1 and φ2 in a series of sample and hold cycles as shown in FIG. 11.

During the sample portion (SAMPLE) of each cycle, the switches 1001 and 1003 are turned on to connect the sample capacitor CS between the input voltage signal VI and GND, while the switches 1002 and 1004 are turned off. This charges the sample capacitor CS according to the input voltage VI, while the voltage across the feedback capacitor CF retains a voltage from a previous sample and hold cycle. In the hold phase (HOLD), the first and third switches 1001 and 1003 are closed, and the second and fourth switches 1002 and 1004 are opened. This connects the sample capacitor CS between the reference voltage signal VR and the non-inverting input of the amplifier 1006. In this phase, the sample and feedback capacitors CS and CF are connected in series with one another between the reference voltage VR and the amplifier output, while the inverting amplifier input operates as a virtual ground. This may cause charge transfer between the capacitors CS and CF to provide an output voltage signal VOUT updated according to the most recent sampling of the input voltage VI.

The integrator circuit 1000 in FIG. 10 has various shortcomings as discussed above. For example, use of the integrator circuit 1000 in a multi-stage analog-to-digital converter circuit leads to a tradeoff between energy efficiency, performance and circuit area. In particular, improved noise and performance specifications require a larger sampling capacitor CS, but increasing the size of the capacitor CS increases the circuit area and power consumption, leading to reduced energy efficiency.

By modeling the single stage transconductance amplifier of gain GM as a two stage circuit shown in FIG. 9, the bandwidth UGB during the hold phase operation of the circuit 1000 is given by the following equation (1):

$$UGB = GM/(2*\pi*CS*(1+GM*Rsw)), \quad (1)$$

where GM=GM1*R*GM2, Rsw is twice the switch resistance of the switches 1001-1004, GM1 and GM2 are the transconductance gain values of the transconductance amplifiers 904 and 906 in the equivalent circuit model of FIG. 9, and CS is the capacitance of the sampling capacitor CS. In a typical design, the bandwidth value UGB is chosen to keep the settling error at the integrator circuit output 903 low so as not to degrade SQNR. The input referred noise power spectral density (PSD)=αKT/CS.

The integrated power and noise specifications are interdependent for the conventional switched capacitor integrator circuit 1000. In particular, once the sampling capacitor CS has been chosen to meet a particular noise specification, the associated integrator gain GM is fixed to meet the bandwidth specification UGB and hence the power of integrator is fixed. Also, improvements in the bandwidth and noise specifications inherently lead to increased sampling capacitor size, and thus increased integrator circuit area.

Figure 1:
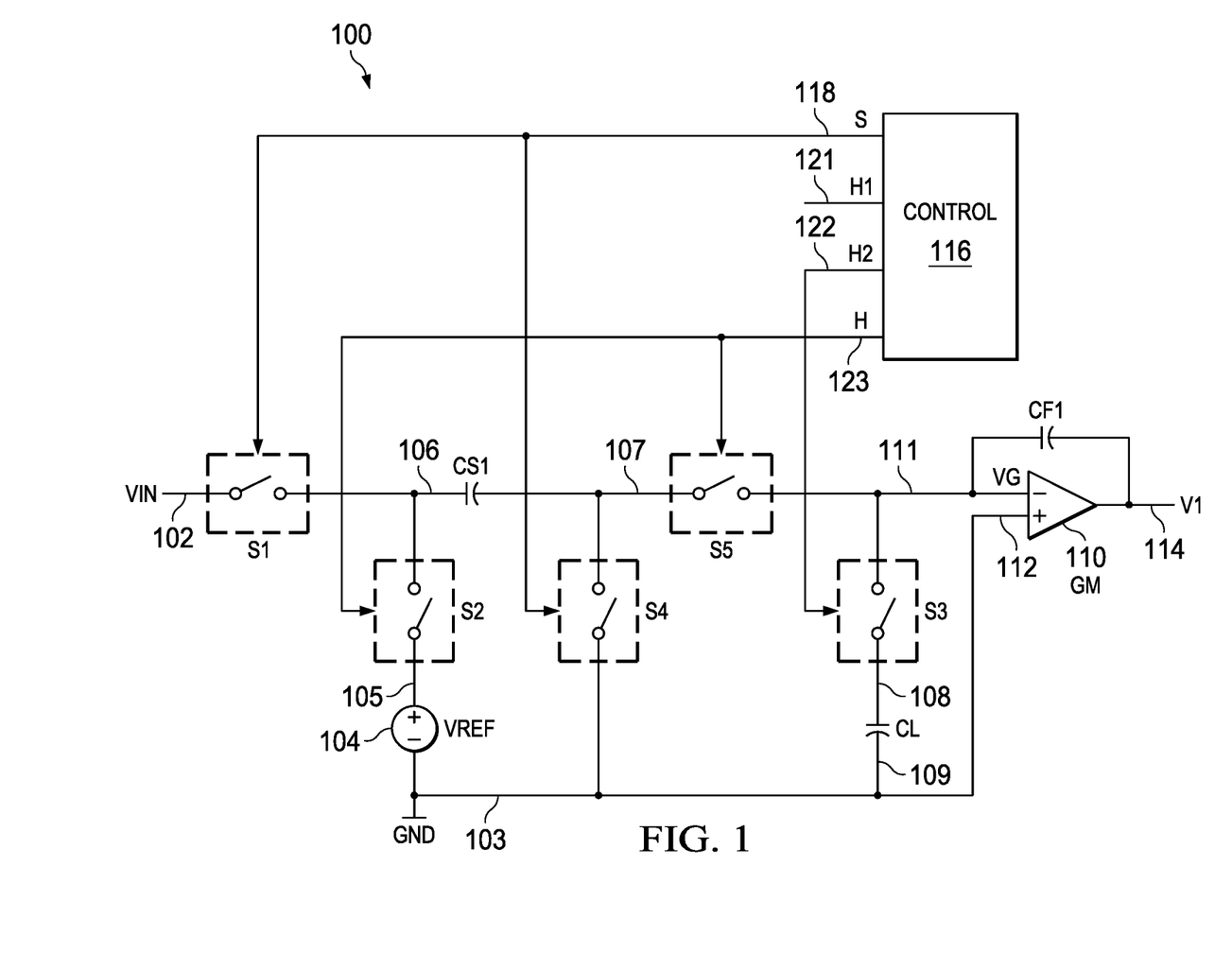
FIG. 1 is a schematic diagram of a switched capacitor integrator circuit.
Figure 2:
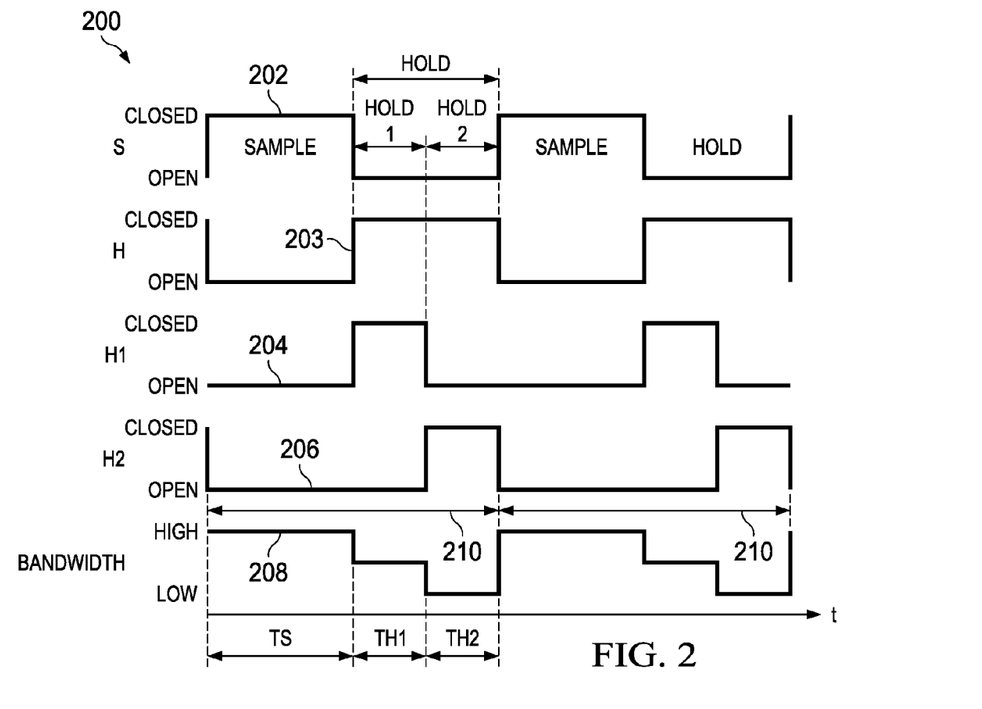
FIG. 2 is a signal diagram showing switching control signals for two example sample and hold cycles in the switched capacitor integrator circuit of FIG. 1.

Referring now to FIGS. 1 and 2, disclosed integrator circuits facilitate adaptation to meet improved noise and performance specifications while allowing a smaller sampling capacitor. Disclosed examples enhance balance between performance specifications, power consumption and circuit area for a given design. FIG. 1 shows a switched capacitor integrator circuit 100, and FIG. 2 provides a signal diagram 200 that shows switching control signals for example sample and hold cycles in the switched capacitor integrator circuit 100. The integrator circuit 100 includes an amplifier 110, a feedback capacitor CF1, a sampling capacitor CS1, a loading capacitor CL, a switching circuit with switches S1-S5, and a controller 116. The controller 116 operates the switching circuit S1-S5 to sample an input signal VIN to the sampling capacitor CS1 during a sample portion of a given sample and hold cycle. The controller 116 also causes the switching circuit to couple the sampling capacitor CS1 to an amplifier input 111 during a first hold portion of each sample and hold cycle. The controller 116 provides a second hold portion of each sample and hold cycle that couples the sampling capacitor CS1 and the loading capacitor CL to the amplifier input 111. This allows noise and bandwidth to be optimized independently and allows smaller circuit area and lower power consumption by the integrator circuit 100.

Noise affects overall performance of a discrete time switched capacitor integrator only at a certain time in a given sample and hold cycle. The integrator bandwidth is important at the beginning of a hold phase when the integrator output has to settle, whereas noise is important at the end of the hold phase to provide a stable output signal to a discrete time circuit. The controller 116 dynamically reconfigures the integrator circuit 100 to implement a hold phase divided into two portions to trade off noise versus bandwidth while keeping power consumption low and constant. The circuit 100 provides a dynamic switched capacitor integrator whose bandwidth and noise can be optimized independently to achieve lower power and area.

The integrator circuit 100 can use any suitable amplifier 110. In one example, the amplifier 110 is a transconductance amplifier (e.g., GMA) with an inverting first amplifier input 111 and a non-inverting second amplifier input 112 connected to a constant voltage node 103 (e.g., GND). In other implementations, a traditional op-amp could be used. The illustrated transconductance amplifier 110 has a single ended output 114. Differential amplifier output implementations are used in other examples (not shown). The illustrated inverting amplifier configuration establishes a virtual ground voltage VG at the first amplifier input 111, where VG is approximately equal to GND.

The amplifier output 114 provides an integrator output signal V1. In certain applications, the integrator circuit 100 is used as an initial or first integrator stage in a second or higher order analog-to-digital converter circuit, such as a example third order Sigma Delta ADC or SDADC as described below in connection with FIG. 3. In such ADC applications, the integrator output signal V1 is provided as an input signal to a succeeding integrator stage. The feedback capacitor CF1 is coupled between the first amplifier input 111 and the amplifier output 114. In the example of FIG. 1, the feedback capacitor CF1 has a first terminal connected to the first amplifier input 111 and a second terminal connected directly to the amplifier output 114. In other examples, the feedback capacitor CF1 is indirectly coupled with one or more intervening circuit components between the first amplifier input 111 and the amplifier output 114 (e.g., through an output capacitor in FIG. 5 below).

The switching circuit in this example includes five switches S1-S5 configured to provide dynamic reconfiguration by the controller 116 to implement a sample portion (e.g., SAMPLE herein) and two hold portions (e.g., HOLD 1 and HOLD 2) of each of a series of successive sample and hold cycles during integrator operation. Other switching circuits can be used, such as a three switch amplifier circuit example described in connection with FIG. 7 below. Any suitable switches can be used, for example, MOSFETs, bipolar transistors, etc. The controller 116 includes signal outputs 118, 121, 122 and 123 which respectively provide switching control signals S, H1, H2 and H in each sample and hold cycle to cause the switching circuit switches S1-S5 to implement the three cycle portions SAMPLE, HOLD 1 and HOLD 2. In the example of FIG. 1, the control signals S, H and H2 change the switch states to control the connections of the sampling capacitor CS1, the feedback capacitor CF1 and the loading capacitor CL.

The sampling capacitor CS1 includes a first terminal 106 and a second terminal 107. The first switch S1 is connected between an integrator input node 102 and the first terminal 106 of the sampling capacitor CS1. The fourth switch S4 is connected between the second terminal 107 of the sampling capacitor CS1 and the constant voltage node 103. The fifth switch S5 is connected between the second terminal 107 of the sampling capacitor CS1 and the first amplifier input 111. The loading capacitor CL includes a first terminal 108 and a second terminal 109. The loading capacitor CL is connected in series with the third switch S3 between the first amplifier input 111 and the constant voltage node 103. In the illustrated example, the third switch S3 is connected between the first amplifier input 111 and the first terminal 108 of the loading capacitor CL, and the second terminal 109 is connected to the constant voltage node 103. The second switch S2 is connected between the first terminal 106 of the sampling capacitor CS1 and a reference voltage node 105. In one example, a reference voltage circuit 104 provides a reference voltage VREF at the reference voltage node 105. In another example, the reference voltage node 105 is connected to the constant voltage node 103 and the circuit 104 can be omitted. In other examples, a feedback signal provides a reference voltage to the reference voltage node 105, such as from an output ADC at the end of a multi-stage SDADC as described below in connection with FIG. 3.

Referring also to the diagram 200 in FIG. 2, the switch states of the switches S1-S5 are either on or off, or open and closed as used hereinafter. Curve 202 shows the S signal, curve 203 shows the H signal, curve 204 shows the H1 signal and curve 206 shows the H2 signal for two example sample and hold cycles 210. A curve 208 in FIG. 2 illustrates the integrator circuit bandwidth. In operation, the controller 116 strategically introduces the loading capacitor CL during the second hold portion to dynamically add loading to enhance noise reduction and reduce circuit bandwidth. In contrast, the controller 116 disconnects the capacitive load CL to reduce the loading and add bandwidth during the first hold portion. In one example, the controller 116 asserts the S signal active high (202 in FIG. 2) to close or turn on NMOS switches S1 and S4 in the SAMPLE portion. In this manner, the controller 116 closes the first switch S1 and the fourth switch S4 during the first non-zero time period TS, and opens the second, third and fifth switches S2, S3 and S5 during the first non-zero time period TS. This connects the integrator input signal VIN from the integrator input node 102 to the sampling capacitor CS1 during a first non-zero time period TS in the sample portion of each sample and hold cycle 210.

The controller 116 asserts the H signal (curve 203) active high to close or turn on NMOS switches S2 and S5 in the hold portion HOLD. This couples the sampling capacitor CS1 between the reference voltage node 105 and the first amplifier input 111 during second and third non-zero time periods TH1 and TH2 following TS in the hold portion HOLD of each cycle 210. The controller 116 opens the switches S1 and S4 during the second and third non-zero time periods TH1 and TH2. As seen in the curve 208 of FIG. 2, the bandwidth is high in the sample time period TS. The first hold portion HOLD 1 provides somewhat lower bandwidth, and temporarily results in high noise and low power consumption in the second time period TH1. The bandwidth can be increased in the HOLD 1 portion without increasing power but at the expense of higher noise, for example, by implementing the transconductance amplifier 110 as a dual-stage circuit in a manner similar to the GM equivalent circuit 900 of FIG. 9. This is beneficial when the integrator output has to swing at the start of the hold phase due to charge re-distribution between CS1 and CF1. In specific implementations, the bandwidth is chosen so that the integrator settles to a predetermined or specified accuracy in the HOLD 1 phase by appropriate selection of the size of the sampling capacitor CS1. Since CS1 is not chosen according to the circuit noise specifications, CS1 can be smaller than would otherwise be required. Accordingly, circuit size and power consumption of the integrator circuit 100 can be reduced.

In addition, the controller 116 asserts the H2 signal (curve 206) active high to close or turn on NMOS switch S3 in the second hold phase HOLD 2. In this manner, the controller 116 closes the third switch S3 and also opens the switches S1 and S4 during a third non-zero time period TH2 following TH1. The composite dual portion hold phase is shown as HOLD in FIG. 2 having a duration TH1+TH2. In the HOLD 2 cycle portion, the sampling capacitor CS1 and the loading capacitor CL are coupled with the first amplifier input 111 via the switches S3 and S5. This further reduces the bandwidth of the integrator circuit 100 (curve 208) in the time period TH2 and reduces power consumption by the integrator circuit 100 in each sample and hold cycle 210. The HOLD 2 portion provides low noise by virtue of the additional capacitive load at the amplifier input 111. This also lowers the bandwidth, but bandwidth is less important towards the end of hold phase when the integrator output has already settled close to the final value during HOLD1. Since the integrator output has already settled, the bandwidth can be reduced, thus reducing noise to meet SQNR, ENOB and other noise specifications for a given design.

The switched capacitor integrator circuit example 100 advantageously divides the hold phase into first and second portions HOLD 1 and HOLD 2, and this approach can advantageously achieve significant power savings (e.g., >50%) in the integrator 100 for the same area as bandwidth can be optimized without increasing noise. Moreover, it is possible to reduce the area as noise can be optimized independent of the effective circuit bandwidth for similar power consumption. Furthermore, for the same power consumption, the integrator power can be kept relatively constant in both the HOLD 1 and HOLD 2 portions while mitigating or avoiding supply noise or ringing. This is an added advantage as it mitigates unwanted supply noise or ringing due to variable current drawn from supply. In the illustrated example, the bandwidth UGB of the integrator circuit 100 during the HOLD 1 and HOLD 2 portions is given according to the following equations (2) and (3), respectively:

$$UGB(H1) \sim GM/CS1, \text{ and} \quad (2)$$

$$UGB(H2) \sim GM/(CS1+CL) \quad (3)$$

Figure 3:
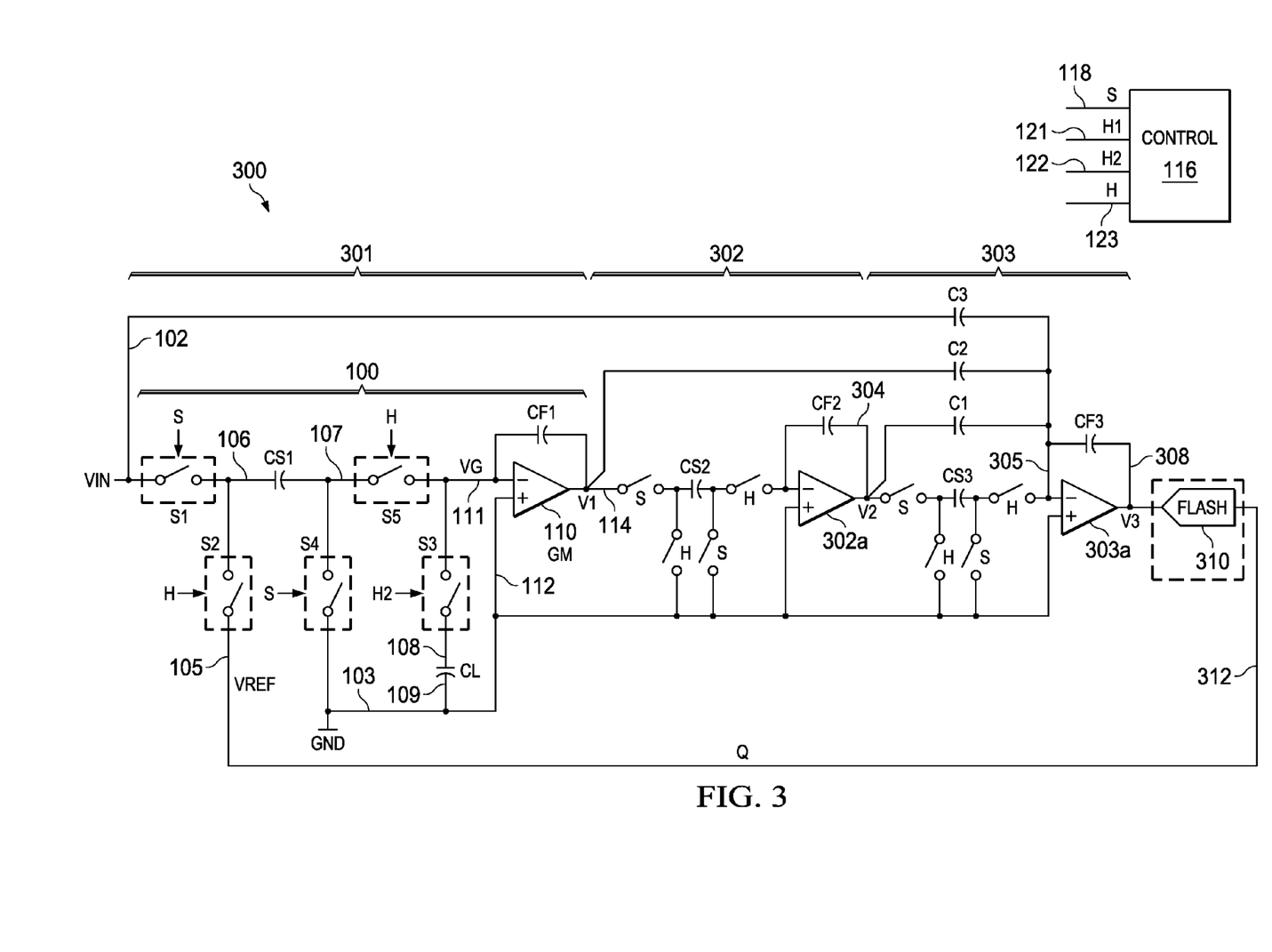
FIG. 3 is a schematic diagram of a three stage discrete time switched capacitor ADC using the integrator circuit of FIG. 1 as the first or initial integrator stage.

FIG. 3 shows a three stage discrete time switched capacitor ADC circuit 300 that includes a first stage 301 with the integrator circuit 100 as described above in FIG. 1 as the first or initial integrator stage. The ADC circuit 300 also includes a second integrator stage 302 and a third integrator stage 303. The additional integrator circuits 302 and 303 individually include corresponding additional amplifiers 302a and 303a, additional feedback capacitors CF2 and CF3 and additional sampling capacitors CS2 and CS3, respectively. The integrator circuits 302 and 303 provide corresponding integrator output signals V2 and V3. The output signal V2 from the second integrator circuit 302 provides an input signal to the third integrator circuit 303. The output signal V3 from the third integrator circuit 303 provides an input to an analog-to-digital converter 310 (e.g., a flash ADC) that operates as a quantizer for the overall circuit 300. The circuit 300 operates as a switched capacitor Sigma Delta converter, in which the ADC input 308 receives the integrator output signal V3 from the final integrator stage 303, and an ADC output 312 is connected to provide the reference signal as a feedback signal VREF to the reference voltage node 105 of the first stage 301. In one possible implementation, the first stage integrator circuit 100, the additional integrator circuits 302, 303, and the ADC 310 form a multiple order cascade of integrator feed-forward OFF Delta Sigma analog-to-digital converter circuit, in which the ADC 310 operates as a quantizer. In this example, moreover, the additional integrator circuits 302 and 303 are configured to operate as conventional switched capacitor integrators according to the above-described samples switching control signal S from the output 118 of the controller 116.

Figure 4:
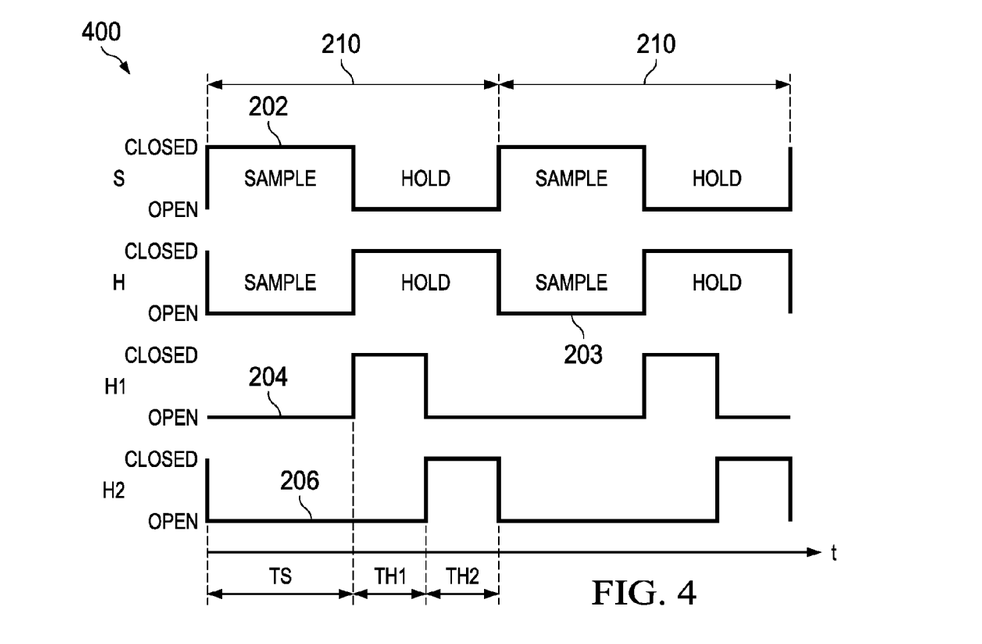
FIG. 4 is a signal diagram showing switching control signals for two example sample and hold cycles in the first stage switched capacitor integrator circuit of FIG. 3.

Referring also to FIG. 4, a signal diagram 400 illustrates two example sample and hold cycles 210, including the S curve 202, the H curve 203, the H1 curve 204 and the H2 curve 206 as described above in connection with the first stage integrator circuit 100 of FIGS. 1 and 2. The switching circuits of the second and third integrator stages 302 and 303 operate according to the S and H signals in order to selectively sample an input voltage at the corresponding sampling capacitor CS2, CS3 while the S signal is asserted, and to then transfer the sampled signal to the corresponding feedback capacitor CF2, CF3 when the H signal is asserted. The circuit 300 in FIG. 3 further includes a first additional feedback capacitor C1 connected between the output 304 of the additional amplifier 303 and the inverting input of the amplifier 303a. Also, the circuit 300 includes a second additional feedback capacitor C2 connected between the output 114 of the amplifier 110 and the inverting input of the amplifier 303a, as well as a third additional feedback capacitor C3 coupled between the integrator input node 102 and the inverting input 305 of the amplifier 303a.

The bandwidth selection control provided by the switching circuit and the control signals H and H2 are particularly beneficial for use in the initial or first integrator stage 301 in the configuration of FIG. 3, because the first integrator is the largest contributor to ADC area and power as it determines the ADC performance parameters such as noise, linearity and SQNR. Non-idealities like noise and non-linearity in second and third integrators will be heavily attenuated by the first integrator. In other implementations, a similar integrator circuit 100 can be used for the second or subsequent integrator stages in a multi-stage (multi-order) analog-to-digital converter circuit. Moreover, the described concepts can be used in association with multi-order ADC circuits of any order, where the second and subsequent additional integrator circuits can be of any desired circuit topology or configuration.

Figure 5:
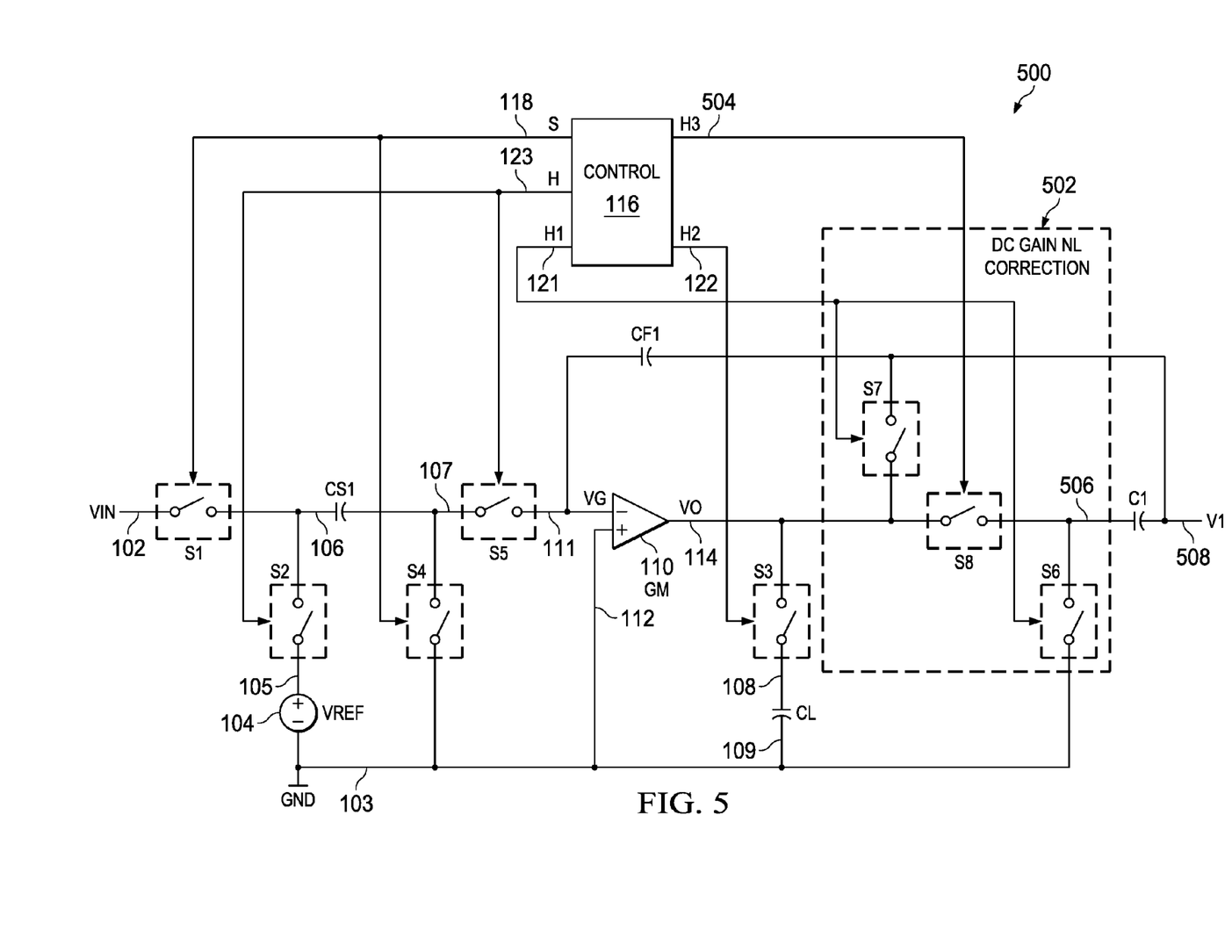
FIG. 5 is a schematic diagram of another example switched capacitor integrator circuit including a DC gain nonlinearity correction circuit.
Figure 6:
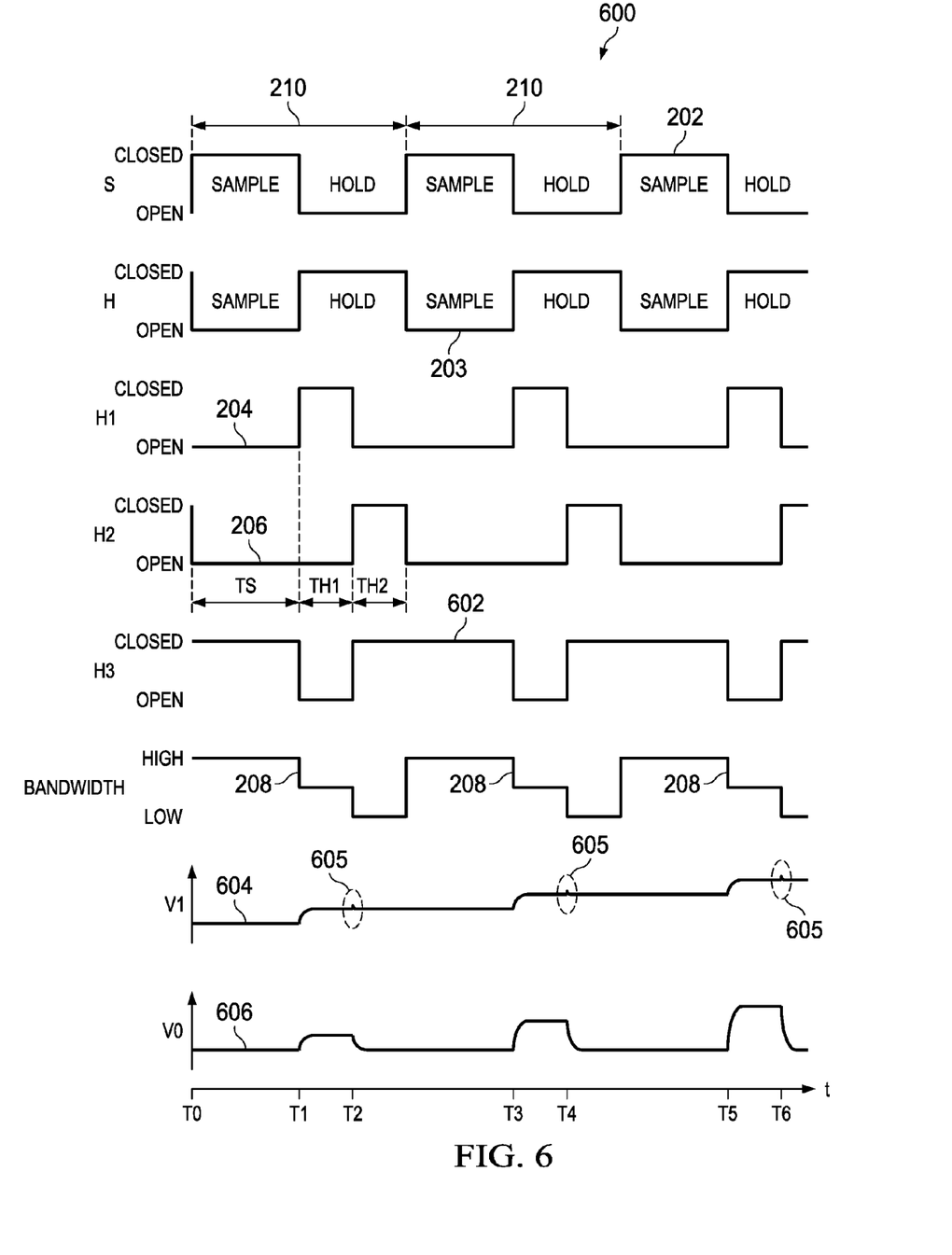
FIG. 6 is a signal diagram showing amplifier and integrator circuit output signals along with switching control signals in the switched capacitor integrator circuit of FIG. 5.

Referring now to FIGS. 5 and 6, FIG. 5 shows another example switched capacitor integrator circuit 500 similar to the integrator circuit 100 in FIG. 1, in this case including a DC gain nonlinearity correction circuit 502. FIG. 6 provides a signal diagram 600 illustrating the above described switching control signals 202 (S), 203 (H), 204 (H1) and 206 (H2), as well as the bandwidth curve 208 for two example sample and hold cycles 210 as previously described. In addition, the controller 116 in FIG. 5 includes a further signal output 504 that provides another switching control signal H3 to the correction circuit 502, illustrated as a curve 602 in the diagram 600 of FIG. 6. FIG. 6 also illustrates a voltage curve 604 illustrating the integrator circuit output signal V1 at an integrator circuit output node 508 in FIG. 5, as well as a curve 606 illustrating the amplifier output signal voltage V0 at the amplifier output 114.

The amplifier circuit 110, the switching circuit switches S1, S2, S4 and S5, the sampling capacitor CS1 and the feedback capacitor CF1 are generally interconnected as described above in connection with FIG. 1. In this example, however, the feedback capacitor CF1 is connected between the first (inverting) amplifier input 111 and the integrator circuit output node 508. In the circuit 500 of FIG. 5, moreover, the loading capacitor CL and the third switch S3 are coupled in series with one another between the amplifier output 114 and the constant voltage node 103. The third switch S3 is again operate according to the H2 signal from the controller output 122 as described above. The circuit 500 additionally includes an output capacitor C1 or series capacitor with a first terminal 506 coupled with the amplifier output 114 and a second terminal connected to the integrator circuit output 508. As shown in FIG. 5, the switching circuit S1-S5 is coupled with the amplifier 110, the integrator input node 102, the reference voltage node 105, and the constant voltage node 103. The controller 116 provides the switching control signals S, H1, H2, H and H3 at the corresponding signal outputs 118, 121, 122, 123 and 504 in each sample and hold cycle 210 to operate the circuit 500 is a switched capacitor integrator.

The correction circuit 502 in this example is a DC gain nonlinearity correction circuit coupled with the amplifier output 114, the integrator circuit output 508, the constant voltage node 103, and the controller 116. The correction circuit 502 in one example includes switches S6-S8 that operate according to the H1 and H3 signals from the controller 116 to selectively couple the output capacitor C1 between the amplifier output 114 and the integrator circuit output 508 during the time periods TS and TH2 (SAMPLE and HOLD 2). During the first hold portion (HOLD 1) in the time period TH1, the correction circuit 502 couples the amplifier output 114 to the integrator circuit output 508 and couples the output capacitor C1 between the integrator circuit output 508 and the constant voltage node 103. The connection of the loading capacitor CL to the amplifier output reduces the bandwidth of the integrator 500 during the second hold phase HOLD 2. In this case, however, the loading capacitor CL is introduced by connection to the amplifier output 114. The amplifier output 114 in this example is equivalent to a virtual ground in the intervals TS and TH2 during which the H3 signal is asserted high due to the operation of the DC gain non-linearity correction circuit 502. The correction circuit 502 provides DC gain non-linearity correction according to the H1 and H3 signals using the selective switching for interconnection of the amplifier output node 114 and the first terminal 506 of the output capacitor C1. During the third time period TH2 when H2 is active high, the output capacitor C1 is connected to the amplifier output node 114, and the circuit 502 operates to reduce any swing in the amplifier output voltage V0 (e.g., to near 0 my as shown at 605 in FIG. 6). In operation, moreover, the integrator circuit output voltage V1 at the integrator circuit output node 508 is regulated by the amplifier 110, and thus the circuit 500 provides a stable integrator output signal V1 with DC gain non-linearity is corrected by the circuit 502.

The curves 604 and 606 of FIG. 6 show the operation for a steady state (e.g., fairly constant) input voltage signal VIN over several sample and hold cycles 210. The integrator output voltage V0 at the node 114 in curve 606 in this example is increased to the level corresponding to the input voltage signal VIN between T1 and T2 during the first hold portion when the H1 signal (curve 204) is active high. The voltage of the V1 integrator circuit output signal also increases at T1. At T2 in this case, when the H3 signal is asserted active high, the amplifier output voltage V0 (curve 606) returns again to the initial level, and the integrator circuit output voltage V1 (curve 604) retains the increased level. As seen at 605 in FIG. 6, the DC gain non-linearity correction circuit 502 serves to counteract any DC gain non-linearities when engaged by the assertion of the H3 signal by the controller 116. Continuing in FIG. 6, another transition from the sample portion occurs at T3, where the integrator output voltage V1 in curve 604 again increases, and the output voltage V0 in curve 606 rises to the level of V1. The H3 signal is again asserted at T4, and the correction circuit 502 again counteracts an initial increase at 605 in the integrator circuit output voltage curve 604. The process is again repeated at T5 and T6 for the next sample and hold cycle as shown in FIG. 6.

The bandwidth UGB of the integrator circuit 500 during the HOLD 1 and HOLD 2 portions is given according to the following equations (4) and (5), respectively:

$$UGB(H1) \sim GM/CS1, \text{ and} \quad (4)$$

$$UGB(H2)GM/(CS1+CL(1+CS1/CF1)). \quad (5)$$

The switched capacitor integrator circuit 500 of FIG. 5 can also be used as an initial or first integrator stage in a multi-stage (multi-order) analog-to-digital converter circuit, such as the example 300 of FIG. 3, including the first stage circuit 501 or more additional integrator circuits as described above. Moreover, this integrator circuit 500 can be incorporated along with one or more additional integrator circuits in a single IC in order to provide a multiple order cascade of integrator feed-forward OFF Delta Sigma analog-to-digital converter circuit, with an output ADC (e.g., 310 above) operating as a quantizer.

Figure 7:
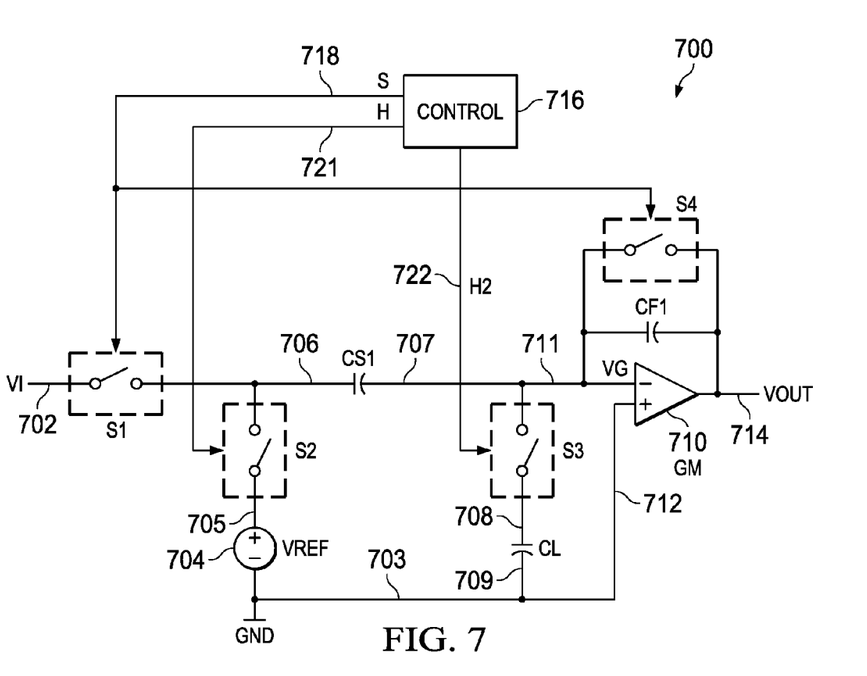
FIG. 7 is a schematic diagram of a switched capacitor amplifier circuit.
Figure 8:
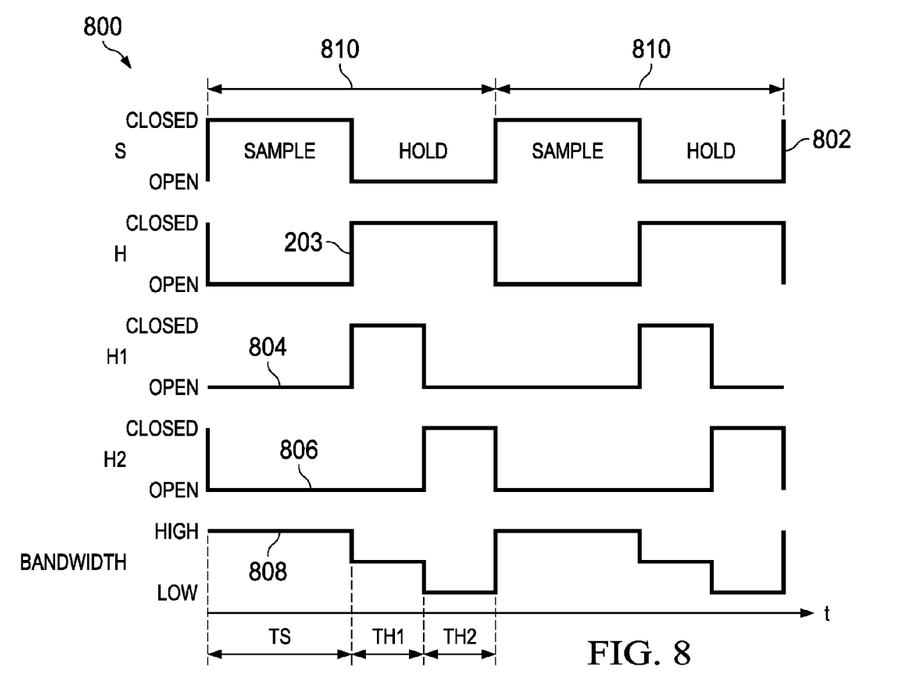
FIG. 8 is a signal diagram showing switching control signals for two example sample and hold cycles in the first stage switched capacitor amplifier circuit of FIG. 7.

FIGS. 7 and 8 illustrate an example switched capacitor amplifier circuit 700 and associated waveforms in a signal diagram 800. The amplifier circuit 700 of FIG. 7 includes a sampling capacitor CS1 along with first and second switches S1 and S2 operated according to S and H signals from a controller 716 as described above. The switching operation alternately samples an input voltage VI from an input node 702 and then transfers the sampled signal to a feedback capacitor CF1 associated with an amplifier 710. A reference voltage circuit 704 provides a reference voltage VREF to the switch S2 at a reference voltage node 705. The switched capacitor amplifier circuit 700 includes an amplifier 710 with an inverting first amplifier input 711, a non-inverting second amplifier input 712 connected to a constant voltage node 703 (e.g., GND), and an amplifier output 714 to provide an output signal VOUT. The sampling capacitor CS1 includes a first terminal 706 connected to the switches S1 and S2, as well as a second terminal 707 connected to the inverting input 711 of the amplifier 710. The third switch S3 is coupled in series with a loading capacitor CL between the inverting input 711 and the constant voltage node 703. In the illustrated example, the loading capacitor CL includes a first terminal 708 connected to the switch S3, and a second terminal 709 connected to the constant voltage node 703. The switch S3 is connected between the first terminal 708 of the loading capacitor CL and the non-inverting amplifier input node 711. The amplifier input node 711 is at a virtual ground potential VG substantially equal to GND. The feedback capacitor CF1 is connected between the input 711 and the output 714. A fourth switch S4 is connected in parallel with the feedback capacitor CF1 between the inverting amplifier input 711 and the amplifier output 714 to selectively discharge the capacitor CF1 according to the sample signal S from the signal output 718 of the controller 716. The controller output 721 provides the H signal to operate the second switch S2, and the controller 716 includes an output 722 that provides an H2 switching control signal to operate the third switch S3.

As seen in a signal diagram 800 of FIG. 8, the controller 716 provides the switching control signals S, H and H2 at the corresponding signal outputs 718, 721 and 722 as shown in curves 802, 203 and 806, respectively, in each of a series of successive cycles 810. In general, the controller 716 operates the outputs 718, 721 and 722 similar to the operation of the controller 116 described above in order to include a SAMPLE portion in a time period TS of each cycle 810 followed by first and second hold portions HOLD 1 in a time period TH1, and HOLD 2 in a time period TH2. Similar to the above described switched capacitor integrator circuit 100 in FIGS. 1 and 2, the signal diagram 800 in FIG. 8 also includes a bandwidth curve 808 showing the selective adaptation of the circuit bandwidth during the time period TH1 and further bandwidth reduction during TH2. As with the above described switched capacitor integrator circuits 100 and 500, the switched capacitor amplifier circuit in FIG. 7 advantageously provides selective coupling of the additional loading capacitor CL to the amplifier 710 in a second portion of each hold phase of the amplifier operating cycles 810. This facilitates reduction in the size of the sampling capacitor CS1 and a corresponding increase in the bandwidth during the first hold time period TH1 to reduce power consumption and circuit area of the amplifier circuit 700. In the second hold portion during the time period TH2, the additional capacitive loading of CL is connected to the amplifier input 711 to reduce the bandwidth and enhance noise performance of the amplifier circuit 700. As seen in FIG. 7, therefore, the switched capacitor architecture with the selective load introduction via S3 and CL has applications beyond switch capacitor integrators, and can be employed in various use cases such as a switched capacitor amplifier 700 or others (not shown). In the amplifier application shown in FIGS. 7 and 8, the amplifier output voltage VOUT is given by the equation VOUT=VIN(CS1/CF1) to provide an amplifier gain of CS1/CF1.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An integrator circuit, comprising:
an amplifier, including a first amplifier input, a second amplifier input connected to a constant voltage node, and an amplifier output to provide an integrator output signal;
a feedback capacitor coupled between the first amplifier input and the amplifier output;
a sampling capacitor, including a first terminal, and a second terminal;
a loading capacitor, including a first terminal, and a second terminal;
a switching circuit coupled with the amplifier, an integrator input node, a reference voltage node, and the constant voltage node; and
a controller, including signal outputs to provide switching control signals in each of a series of successive sample and hold cycles to cause the switching circuit to:
connect an integrator input signal from the integrator input node to the sampling capacitor during a first non-zero time period in a sample portion of each sample and hold cycle,
couple the sampling capacitor between the reference voltage node and the first amplifier input during a second non-zero time period following the first non-zero time period in a first hold portion of each sample and hold cycle, and
couple the sampling capacitor and the loading capacitor to the first amplifier input to reduce a bandwidth of the integrator circuit and reduce power consumption by the integrator circuit during a third non-zero time period following the second non-zero time period in a second hold portion of each sample and hold cycle.

2. The integrator circuit of claim 1,
wherein the switching circuit includes a first switch connected between the integrator input node and the first terminal of the sampling capacitor, a second switch connected between the first terminal of the sampling capacitor and the reference voltage node, and a third switch connected in series with the loading capacitor between the first amplifier input and the constant voltage node; and
wherein the controller is operative to provide the switching control signals in each of the sample and hold cycles to cause the switching circuit to:
close the first switch during the first non-zero time period, and open the second and third switches during the first non-zero time period,
close the second switch during the second non-zero time period, and open the first and third switches during the second non-zero time period, and
close the second and third switches during the third non-zero time period, and open the first switch during the third non-zero time period.

3. The integrator circuit of claim 2,
wherein the switching circuit further includes a fourth switch connected between the second terminal of the sampling capacitor and the constant voltage node, and a fifth switch connected between the second terminal of the sampling capacitor and the first amplifier input; and
wherein the controller is operative to provide the switching control signals to concurrently open and close the first and fourth switches in each of the sample and hold cycles, and concurrently open and close the second and fifth switches in each of the sample and hold cycles.

4. The integrator circuit of claim 3, wherein the amplifier is a transconductance amplifier, wherein the first amplifier input is an inverting amplifier input, and wherein the second amplifier input is a non-inverting amplifier input.

5. The integrator circuit of claim 3, further comprising:
at least one additional integrator circuit, including an additional amplifier, an additional feedback capacitor, an additional sampling capacitor, and an additional switching circuit to sample an output signal of a preceding integrator circuit at the additional sampling capacitor and to transfer the output signal to the additional feedback capacitor to provide a corresponding additional integrator output signal; and
an analog-to-digital converter (ADC), including an ADC input coupled to receive the integrator output signal from a final one of the at least one additional integrator circuit, and an ADC output connected to the reference voltage node.

6. The integrator circuit of claim 5, wherein the integrator circuit, the at least one additional integrator circuit, and the ADC form a multiple order cascade of integrator feed-forward (CIFF) Delta Sigma analog-to-digital converter circuit, with the ADC operating as a quantizer.

7. The integrator circuit of claim 2, wherein the amplifier is a transconductance amplifier, wherein the first amplifier input is an inverting amplifier input, and wherein the second amplifier input is a non-inverting amplifier input.

8. The integrator circuit of claim 2, further comprising:
at least one additional integrator circuit, including an additional amplifier, an additional feedback capacitor, an additional sampling capacitor, and an additional switching circuit to sample an output signal of a preceding integrator circuit at the additional sampling capacitor and to transfer the output signal to the additional feedback capacitor to provide a corresponding additional integrator output signal; and
an analog-to-digital converter (ADC), including an ADC input coupled to receive the integrator output signal from a final one of the at least one additional integrator circuit, and an ADC output connected to the reference voltage node.

9. The integrator circuit of claim 8, wherein the integrator circuit, the at least one additional integrator circuit, and the ADC form a multiple order cascade of integrator feed-forward (CIFF) Delta Sigma analog-to-digital converter circuit, with the ADC operating as a quantizer.

10. An integrator circuit, comprising:
an amplifier, including a first amplifier input, a second amplifier input connected to a constant voltage node, and an amplifier output to provide an amplifier output signal;
a feedback capacitor coupled between the first amplifier input and an integrator circuit output to provide an integrator circuit output signal;
a sampling capacitor, including a first terminal, and a second terminal;
a loading capacitor, including a first terminal, and a second terminal;

an output capacitor, including a first terminal coupled with the amplifier output, and a second terminal connected to the integrator circuit output;

a switching circuit coupled with the amplifier, an integrator input node, a reference voltage node, and the constant voltage node; and a controller, including signal outputs to provide switching control signals in each of a series of successive sample and hold cycles to cause the switching circuit to:

connect an integrator input signal from the integrator input node to the sampling capacitor during a first non-zero time period in a sample portion of each of a series of successive sample and hold cycles, couple the sampling capacitor between the reference voltage node and the first amplifier input during a second non-zero time period following the first non-zero time period in a first hold portion of each sample and hold cycle, and couple the sampling capacitor with the first amplifier input and couple the loading capacitor to the amplifier output to reduce a bandwidth of the integrator circuit and reduce power consumption by the integrator circuit during a third non-zero time period following the second non-zero time period in a second hold portion of each given sample and hold cycle.

11. The integrator circuit of claim 10, wherein the switching circuit includes a first switch connected between the integrator input node and the first terminal of the sampling capacitor, a second switch connected between the first terminal of the sampling capacitor and the reference voltage node, a third switch connected in series with the loading capacitor between the amplifier output and the constant voltage node, a fourth switch connected between the second terminal of the sampling capacitor and the constant voltage node, and a fifth switch connected between the second terminal of the sampling capacitor and the first amplifier input; and wherein the controller is operative to provide the switching control signals in each of the sample and hold cycles to cause the switching circuit:

close the first and fourth switches during the first non-zero time period, and open the second, third and fifth switches during the first non-zero time period, close the second and fifth switches during the second non-zero time period, and open the first, third and fourth switches during the second non-zero time period, and close the second, third and fifth switches during the third non-zero time period, and open the first and fourth switches during the third non-zero time period.

12. The integrator circuit of claim 11, further comprising a correction circuit coupled with the amplifier output, the integrator circuit output, the constant voltage node, and the controller, the correction circuit operative according to the switching control signals to:

couple the output capacitor between the amplifier output and the integrator circuit output during the first and third non-zero time periods; and couple the amplifier output to the integrator circuit output during the second non-zero time period, and couple the output capacitor between the integrator circuit output and the constant voltage node during the second non-zero time period.

13. The integrator circuit of claim 12, wherein the correction circuit includes a sixth switch connected between the first terminal of the output capacitor and the constant voltage node, a seventh switch connected between the amplifier output and the integrator circuit output, and an eighth switch connected between the amplifier output and the first terminal of the output capacitor; and wherein the controller is operative to provide the switching control signals in each of the sample and hold cycles to cause the correction circuit to:

close the eighth switch) during the first and third non-zero time periods, and open the sixth and seventh switches during the first and third non-zero time periods, and close the sixth and seventh switches during the second non-zero time period, and open the eighth switch during the second non-zero time period.

14. The integrator circuit of claim 11, wherein the amplifier is a transconductance amplifier, wherein the first amplifier input is an inverting amplifier input, and wherein the second amplifier input is a non-inverting amplifier input.

15. The integrator circuit of claim 11, further comprising:

at least one additional integrator circuit, including an additional amplifier, an additional feedback capacitor, an additional sampling capacitor, and an additional switching circuit to sample an output signal of a preceding integrator circuit at the additional sampling capacitor and to transfer the output signal to the additional feedback capacitor to provide a corresponding additional integrator output signal; and an analog-to-digital converter (ADC), including an ADC input coupled to receive the integrator output signal from a final one of the at least one additional integrator circuit, and an ADC output connected to the reference voltage node.

16. The integrator circuit of claim 15, wherein the integrator circuit, the at least one additional integrator circuit, and the ADC form a multiple order cascade of integrator feed-forward (CIFF) Delta Sigma analog-to-digital converter circuit, with the ADC operating as a quantizer.

17. A switched capacitor amplifier circuit, comprising:

an amplifier, including a first amplifier input, a second amplifier input connected to a constant voltage node, and an amplifier output to provide an output signal;

a feedback capacitor connected between the first amplifier input and the amplifier output;

a sampling capacitor, including a first terminal, and a second terminal connected to the first amplifier input;

a loading capacitor, including a first terminal, and a second terminal;

a switching circuit coupled with the amplifier, a signal input node, a reference voltage node, and the constant voltage node; and a controller, including signal outputs to provide switching control signals in each of a series of successive cycles to cause the switching circuit to:

connect the signal input node to the first terminal of the sampling capacitor during a first non-zero time period in a sample portion of each cycle, and connect the first amplifier input to the amplifier output during the first non-zero time period of each cycle, disconnect the signal input node from the first terminal of the sampling capacitor during a second non-zero time period following the first non-zero time period in a first hold portion of each cycle, and connect the sampling capacitor between the reference voltage node and the first amplifier input during the second non-zero time period, and connect the sampling capacitor and the loading capacitor to the first amplifier input to reduce a bandwidth of the amplifier circuit and reduce power consumption by the amplifier circuit during a third non-zero time period following the second non-zero time period in a second hold portion of each cycle.

18. The switched capacitor amplifier circuit of claim 17, wherein the switching circuit includes a first switch connected between the signal input node and the first terminal of the sampling capacitor, a second switch connected between the first terminal of the sampling capacitor and the reference voltage node, a third switch connected in series with the loading capacitor between the first amplifier input and the constant voltage node, and a fourth switch connected between the first amplifier input and the amplifier output; and wherein the controller is operative to provide the switching control signals in each of the cycles to cause the switching circuit to:

close the first and fourth switches during the first non-zero time period, and open the second and third switches during the first non-zero time period, close the second switch during the second non-zero time period, and open the first, third and fourth switches during the second non-zero time period, and close the second and third switches during the third non-zero time period, and open the first and fourth switches during the third non-zero time period.

19. The switched capacitor amplifier circuit of claim 18, wherein the amplifier is a transconductance amplifier, wherein the first amplifier input is an inverting amplifier input, and wherein the second amplifier input is a non-inverting amplifier input.

20. The switched capacitor amplifier circuit of claim 17, wherein the amplifier is a transconductance amplifier, wherein the first amplifier input is an inverting amplifier input, and wherein the second amplifier input is a non-inverting amplifier input.

* * * * *